United States Patent
Besch et al.

(10) Patent No.: US 12,120,824 B2
(45) Date of Patent: Oct. 15, 2024

(54) PLACEMENT HEAD WITH TWO ROTOR ARRANGEMENTS WITH INDIVIDUALLY ACTUATABLE HANDLING DEVICES

(71) Applicant: ASMPT GmbH & Co. KG, Munich (DE)

(72) Inventors: Karl-Heinz Besch, Olching (DE); Thomas Bliem, Neuried (DE); Thomas Rossmann, Utting (DE); Klaus Sattler, Munich (DE); Michele Trigiani, Munich (DE); Markus Huber, Riemerling (DE)

(73) Assignee: ASMPT GMBH & CO. KG (DE)

( * ) Notice: Subject to any disclaimer, the term of this patent is extended or adjusted under 35 U.S.C. 154(b) by 155 days.

(21) Appl. No.: 17/350,027

(22) Filed: Jun. 17, 2021

(65) Prior Publication Data

US 2021/0400857 A1 Dec. 23, 2021

(30) Foreign Application Priority Data

Jun. 22, 2020 (DE) ...................... 10 2020 116 385.1

(51) Int. Cl.
*H05K 13/04* (2006.01)
*H05K 13/02* (2006.01)
*H05K 13/08* (2006.01)

(52) U.S. Cl.
CPC ..... *H05K 13/0408* (2013.01); *H05K 13/0812* (2018.08); *H05K 13/02* (2013.01)

(58) Field of Classification Search
CPC ........... H05K 13/0408; H05K 13/0812; H05K 13/02; H05K 13/041; H05K 13/0404; H05K 3/341; H05K 13/0406
See application file for complete search history.

(56) References Cited

U.S. PATENT DOCUMENTS 10,935,150 B2 * 3/2021 Ito ........................... H05K 13/08
2005/0132565 A1 * 6/2005 Aoki ................... H05K 13/0406
29/742

(Continued)

FOREIGN PATENT DOCUMENTS

CN 101562966 A 10/2009
CN 107114011 A 8/2017

(Continued)

*Primary Examiner* — Jeffrey T Carley
*Assistant Examiner* — Jose K Abraham
(74) *Attorney, Agent, or Firm* — OSTROLENK FABER LLP (57) ABSTRACT

A placement head for automatically placing electronic components on a component carrier. The placement head has a chassis; a first rotor assembly that is mounted so that it is rotatable relative to the chassis about a first axis of rotation and that has a first quantity of first handling devices; and a second rotor assembly that is mounted so that it is rotatable relative to the chassis about a second axis of rotation and that has a second quantity of second handling devices. Each handling device includes a sleeve to which a component holding device for temporarily picking up a component can be attached, and a drive device with a linear drive for moving the sleeve along its longitudinal axis, and a rotary drive for rotating the sleeve about its longitudinal axis. Furthermore, a placement machine with such a placement head and a method for automatic assembly of a component carrier using such a placement head.

12 Claims, 5 Drawing Sheets

(56) References Cited

U.S. PATENT DOCUMENTS

| | | | |
|---|---|---|---|
| 2006/0048378 A1* | 3/2006 | Jonke | H05K 13/041 29/739 |
| 2006/0103151 A1* | 5/2006 | Usui | H05K 13/041 414/752.1 |
| 2006/0112545 A1* | 6/2006 | Hwang | H05K 13/0411 29/832 |
| 2012/0159781 A1* | 6/2012 | Masahiro | H05K 13/041 29/832 |
| 2013/0255057 A1* | 10/2013 | Komatsu | H05K 13/041 269/57 |
| 2014/0215812 A1* | 8/2014 | Yamamoto | H05K 13/0413 29/739 |
| 2018/0006543 A1 | 1/2018 | Kawaguchi et al. | |
| 2018/0238960 A1* | 8/2018 | Fu | G01R 31/2887 |
| 2018/0303015 A1* | 10/2018 | Koch | H01L 21/67132 |
| 2019/0122917 A1* | 4/2019 | Lohmeier | H01L 21/68764 |
| 2020/0407176 A1* | 12/2020 | Danek | B65G 47/91 |

FOREIGN PATENT DOCUMENTS

| | | | | |
|---|---|---|---|---|
| DE | 102008019100 B3 | | 8/2009 | |
| DE | 102016117815 A1 | | 3/2018 | |
| DE | 102018122593 B3 | | 2/2020 | |
| EP | 2111092 A2 | | 10/2009 | |
| EP | 3250018 A1 | | 11/2017 | |
| JP | H 03-268488 A | | 11/1991 | |
| JP | 2003101291 A | * | 4/2003 | |
| JP | 2003-273582 A | | 9/2003 | |
| JP | 4391290 B2 | * | 12/2009 | |
| JP | 4408741 B2 | * | 2/2010 | |
| JP | 4545822 B2 | * | 9/2010 | |
| JP | 2012-164881 A | | 8/2012 | |
| JP | 5954945 B2 | | 2/2013 | |
| JP | 2013038358 A | * | 2/2013 | |
| JP | 2016-122754 A | | 7/2016 | |
| JP | 6445319 B2 | | 12/2018 | |
| JP | 6570550 B2 | | 9/2019 | |
| JP | 2020047922 A | * | 3/2020 | H05K 13/0409 |
| WO | WO 2016/117009 A1 | | 7/2016 | |
| WO | WO-2019202678 A1 | * | 10/2019 | |

\* cited by examiner

PLACEMENT HEAD WITH TWO ROTOR ARRANGEMENTS WITH INDIVIDUALLY ACTUATABLE HANDLING DEVICES

TECHNICAL FIELD

The present invention relates generally to the technical field of component placement technology. The present invention relates in particular to a placement head for a placement machine for the automatic placement of electronic components on component carriers, wherein the placement head has a plurality of handling devices that can be rotated around an axis of rotation and that are configured to temporarily seize an electronic component by means of a component holding device. The present invention further relates to a placement machine with such a placement head and a method for the placement of components on component carriers with such a placement head.

BACKGROUND OF THE INVENTION

Due to the increasing miniaturization of electronic assemblies, there is a high demand for component placement accuracy among modern placement devices or placement machines. Due to the high price pressure in the electronics industry, placement machines must also have a high placement rate so that the electronic assemblies can be manufactured swiftly and thus inexpensively.

A high placement rate can be achieved with high-performance placement machines that place surface mount devices (SMD) on component carriers using the so-called "Collect & Place" principle. In a "Collect & Place" process cycle, a placement head, which has a plurality of component holding devices that each pick up and hold a component, first picks up a plurality of components from a component feeding system that has a plurality of component feeding devices, which are often also called "feeders". The plurality of components that have been picked up are then transported by the placement head into a placement area in which a component carrier that is to be assembled is located. There, the transported components are placed one after another on the upper side of the component carrier in such a way that the component connections located on the underside of the components come into contact with the corresponding connection surfaces or connection pads that are formed on the upper side of the component carrier. At the end of the process cycle, the placement head is then moved again in the direction of a collection area in which the component feeding system is located. A new process cycle can then begin by picking up additional electronic components once again.

In order to avoid having to move the entire placement head along a z-direction perpendicular to a placement plane, either when picking up a component from a component feeding system or when placing the component on a component carrier, the holding devices of a so-called multiple placement head are displaceable relative to the chassis of the multiple placement head along the z-direction. For example, a linear motor can be used for such a z-displacement. In this case, a common linear drive, which is typically consecutively engaged with a plurality of sleeves, can be provided for a plurality of holding devices, on each of which a component holding device is detachably affixed. In order to be able to place a component in a correct angular position on the component carrier to be assembled, the sleeves or the holding devices are typically rotatable about their respective longitudinal axes.

As described above, a Collect & Place process cycle comprises the following four process phases:
(1) collecting the components,
(2) transporting the components,
(3) placing components on the component carrier and
(4) transporting the placement head back.

The placement rate of a placement machine can be increased most effectively by optimizing process phases (1) and (3).

JP 2012-164881 A discloses a cylinder-type turret head (a so-called "turret placement head"), which has two cylindrical rotor assemblies that can be rotated in discrete angular steps independently of one another about a common axis of rotation, which during the assembly is oriented perpendicular to the surface of a component carrier to be assembled. Eight component holding devices in the form of suction nozzles are attached to each rotor assembly. Furthermore, two so-called z-drives are assigned to each rotor assembly, by means of which two of the eight suction nozzles can be moved relative to a housing of the cylinder-type turret head along a z-axis that is oriented parallel to the common axis of rotation. The distance between a first suction nozzle of the first rotor and a second suction nozzle of the second rotor can be set by a discrete change in the angle of rotation of one rotor relative to the other rotor. If this distance corresponds to the distance between two electronic components that are to be collected, which have been supplied by a component feeding system, then these two components can be removed from a component feeding system at the same time. This contributes to an increase in the efficiency of collecting components in an obvious manner. For a (further) improvement in the placement rate, the above-mentioned process phase (3), in which the components are placed on the relevant component carrier, is thus particularly critical.

SUMMARY OF THE INVENTION

The object of the present invention is to improve the placement rate of a placement machine.

This object is achieved by the subject matter of the independent claims. Advantageous embodiments of the present invention are described in the dependent claims.

According to a first aspect of the invention, a placement head is described for automatically placing electronic components on a component carrier. The described placement head has (a) a chassis; (b) a first rotor assembly that is mounted so that it is rotatable relative to the chassis about a first axis of rotation and that has a first quantity of first handling devices; and (c) a second rotor assembly that is mounted so that it is rotatable relative to the chassis about a first axis of rotation and that has a second quantity of second handling devices. Each (first and second) handling device has (i) a sleeve to which a component holding device for temporarily picking up a component can be attached, and (ii) a drive device that has a linear drive for moving the sleeve along its longitudinal axis and a rotary drive for rotating the sleeve about its longitudinal axis.

The described placement head is based on the recognition that, through individual actuation of each sleeve of the placement head, processes during the placement of components on component carriers can be (temporally) parallelized. This enables a significant increase in the placement rate of the placement head, wherein the term "placement rate" signifies the number of components that can be picked up by the placement head from a component feeding system and placed on the component carriers that are to be assembled within a certain period of time.

For example, two or more components can be picked up at the same time by a component feeding system with a plurality of component feeding devices arranged next to one another if a suitable setting of the relative angle of rotation between the two rotor assemblies ensures that the distance between the two or more handling devices involved is precisely as great as the distance between the component collection positions of the component feeding devices provided for the multiple component pick-up process. Almost any distance can be set between two handling devices if at least a first handling device of the first rotor assembly and a second handling device of the second rotor assembly are involved in the component pick-up process.

Correspondingly, two or more components can also be placed on a component carrier at the same time. Here too (in addition to the obviously necessary suitable positioning of the entire placement head), it is only necessary to ensure that the relative angle of rotation between the two rotor assemblies ensures relative spacing between (i) at least a first handling device of the first rotor assembly and (ii) at least a second handling device of the second rotor assembly, wherein this relative spacing corresponds precisely to the distance between the relevant placement positions on the component carrier.

It should be noted that, if the dimensioning of the geometries of the two rotor assemblies is suitable, it may also be possible to simultaneously remove two or more components from different component feeding devices of a component feeding system with the cylinder turret head described in the introduction and known from JP 2012-164881 A. The component collection positions of a component feeding system are typically located on a fixed spatial grid to which the geometries of the two rotor assemblies can be adapted. In contrast to this, the various placement positions on a component carrier that is to be assembled are not generally located on a fixed grid. However, in order to be able to simultaneously place at least two components at the respectively appropriate points, it must be possible, on the one hand, to continuously adjust the relative angle of rotation between the two rotor assemblies and, on the other hand, to individually actuate the sleeves or component holding devices that are involved. Only then can the sleeves specifically be displaced along their longitudinal axis and rotated about their longitudinal axis independently of the current rotation angle position of the rotor assembly in question. This ability to individually actuate all sleeves according to the invention thus advantageously enables not only a plurality of components to be simultaneously picked up from a component feeding system but also, in particular, the simultaneous placement of a plurality of components on a component carrier at placement positions spaced differently from one another.

All first handling devices are preferably arranged on a first circumference at a first radial distance from the first axis of rotation. Correspondingly, all second handling devices are preferably arranged on a second circumference at a second radial distance from the second axis of rotation.

In this document, the term "electronic component" or "component" can be understood to mean all elements that can be placed on or attached to or mounted on a component carrier. The term "component" can include housed components and in particular unhoused components or chips. These include two- or multi-pole SMT components or other highly integrated flat, round or differently shaped components such as ball grid arrays, bare dies, flip chips or individual parts such as semiconductor chips of a semiconductor wafer, which may be further processed into finished components, in particular after structuring and cutting the wafer. However, in this document, the term "electronic component" also includes electronically inactive or passive components such as electrical plugs or connectors, heat sinks, shielding elements, housing parts, etc. that can be placed on a carrier.

In this document, the term "component carrier" can be understood to mean any type of media on which components can be placed, in particular substrates or printed circuit boards. A medium on which components can be placed, in particular a printed circuit board, can be rigid or flexible. It can also have both at least one first rigid area and at least one second flexible area. A medium on which components can be placed can also be a temporary carrier on which unhoused chips are mounted for the purpose of manufacturing components, for example by means of a so-called "embedded wafer level package" (eWLP) process. Such a temporary carrier can be an adhesive foil that is stretched onto a frame in a known manner. The adhesive foil can be a heat-releasable foil (a so-called thermo release foil), so that glued-on chips can be detached from the (previously) adhesive film in a simple manner using thermal energy.

In this document, the term "sleeve" can be understood to mean any type of (elongated) coupling structure that is used in a known manner on conventional placement heads (without the "pneumatic functionality" described in this document) to attach a component holding device such as a jawed gripper or suction nozzle to the placement head and move this component holding device along a z-axis relative to the chassis of the placement head. Where the component holding device is a suction nozzle, the negative pressure described above, which is generated by a vacuum generating unit, is transmitted to a surface of the relevant component via an air channel inside the suction nozzle.

According to one embodiment of the invention, the first axis of rotation and the second axis of rotation are parallel. This has the advantage that the sleeves of all handling devices lie in a common plane. This applies in any case when all the sleeves of the first handling devices are in the same longitudinal position in relation to the first axis of rotation, and all the sleeves of the second handling devices are in the same longitudinal position in relation to the second axis of rotation. In this context, "longitudinal position" means a specific coordinate of a cylinder coordinate system, wherein the respective axis of rotation is always the axis of the cylinder.

When the placement head is in operation with parallel axes of rotation, it can then be oriented or positioned such that this common plane lies parallel to a placement plane and thus all handling devices are at least approximately the same distance from the placement plane. In particular, this distance does not depend on the current angle of rotation of the rotor assembly in question. The actuation of the drive device for the respective handling device can thus advantageously be the same for all angles of rotation of the rotor assembly, both when picking up a component and placing it.

According to a further embodiment of the invention, the first axis of rotation and the second axis of rotation are on a common axis of rotation. This means that the two axes of rotation are collinear.

The use of a common axis of rotation means that the two rotor assemblies are arranged concentrically to one another. As a result, the described placement head can be constructed in a compact and comparatively simple form.

According to a further embodiment of the invention, the first axis of rotation is offset in relation to the second axis of rotation. This means that the two rotor assemblies are arranged in a nonconcentric manner to one another.

In particular, an inner rotor assembly of the two rotor assemblies can be arranged eccentrically in relation to the other outer rotor assembly. This means that there is at least one first handling device for each (relative) angular position of the two rotor assemblies, which is spaced particularly close to at least one second handling device. On the opposite side for this (relative) angular position, there is then another first handling device that is at a particularly large distance from at least another second handling device. This eccentricity makes it possible to simultaneously pick up or set down two components that are at a particularly small distance from one another when there is a first (relative) angular position between the two rotor assemblies. When there is a second (relative) angular position between the two rotor assemblies, two components that are at a particularly large distance from one another can be picked up or set down at the same time. This means that, in comparison to a concentric rotor arrangement, a particularly large range of distances is provided for simultaneous component handling (picking up or setting down). A high degree of flexibility is thus achieved for the described placement head with regard to the assembly of different circuit board layouts on different component carriers.

According to a further embodiment of the invention, the placement head further comprises (a) a first motor for rotating the first rotor assembly; and (b) a second motor for rotating the second rotor assembly. The two motors can thereby be controlled independently of one another, so that the first rotor assembly can be rotated independently of the second rotor assembly. This has the advantage that, even with motors with discrete motor settings or motor positions, a plurality of different distances can be set between a first handling device and a second handling device. This enables, for example, (at least) two electronic components to be picked up or taken up simultaneously for a plurality of distances between the corresponding (at least) two component collection positions of a component feeding system with (at least) two component feeding devices.

According to a further embodiment of the invention, the first motor is configured to rotate the first rotor assembly continuously or at least quasi-continuously. Alternatively or in combination therewith, the second motor is configured to rotate the second rotor assembly continuously or at least quasi-continuously. As a result, the above-mentioned distance between a first handling device and a second handling device can be set to any value that lies within a specified range of distances. The specified range of distances depends on the geometry of the placement head. This includes in particular (i) a first radial distance of the first handling devices from the first axis of rotation, (ii) a second radial distance of the second handling devices from the second axis of rotation and any offset present between the first axis of rotation and the second axis of rotation.

The term "quasi-continuous" can be understood to mean angles of rotation that are significantly smaller in comparison to the angular distance between two adjacent first handling devices or the angular distance between two adjacent second handling devices, in particular by a factor of 10, preferably by a factor of 100 and more preferably by a factor of 1000. Such small angles of rotation can be achieved, for example, with stepper motors, wherein a step corresponds to one such small angle of rotation or one such small change in the angle of rotation.

The functionality of the described continuous or quasi-continuous rotation need not only be used when two components are placed at the same time at any distance (within the above-mentioned specified range of distances). This functionality can also be advantageously used when components are taken up at the same time if the components in question are supplied at their collection position with a certain positioning tolerance. For example, this may be the case when the components are transported to the collection position in a so-called component pocket of a component belt, wherein the component pocket is somewhat larger than the component. The rather small positioning tolerance that typically results can be compensated for, if necessary, by means of a corresponding fine adjustment in the angular position of the first rotor assembly and/or of the second rotor assembly. For this purpose, the exact position of the component that is still located in the component pocket can be determined in a known manner by means of a camera and a downstream image evaluation unit. Furthermore, the described functionality of the continuous or quasi-continuous rotation of at least one rotor assembly can also be used to compensate for (i) a possibly undesired positional deviation of a component feeding device to the (chassis of the) placement machines and/or (ii) an undesired positional deviation of a component pocket to the relevant component feeding device.

For some embodiments, fine adjustment of the spacing between the tips of two or more component holding devices is achieved by using so-called eccentric component holding devices and/or eccentric sleeves. The distance between the tips of various component holding devices can then be adjusted, namely by an individual and suitable rotation of the relevant sleeve. Such a fine adjustment can be particularly advantageous if three or four components are to be picked up by the component feeding system at the same time and/or are to be placed on the component carrier from predetermined positions.

According to a further embodiment of the invention, a first quantity of the first handling devices is the same as a second quantity of the second handling devices. This has the advantage that there are always pairs of two handling devices, a first handling device and a second handling device, which can be used for picking up two components simultaneously and for putting down two components simultaneously.

It is obvious that the "multiple output capacity" of the placement head increases with an increasing number of handling devices, wherein the descriptive term "multiple output capacity" refers to the maximum number of components that can be picked up by the placement head and transported together into the placement area.

The first quantity and/or second quantity of handling devices can be at least four, preferably at least six and more preferably at least eight in number. Configurations of the described placement head with two times eight (2×8) handling devices, 2×10 handling devices or 2×16 handling devices have proven to be advantageous in practice because, depending on the respective requirements of the placement operation, a good compromise between the complexity of the placement head and its "multiple output capacity" can be achieved.

According to a further embodiment of the invention, the first handling devices are arranged on a first circumference at a first radial distance from the first axis of rotation, wherein the circumferential distance along the first circumference between two adjacent first handling devices is different from an additional circumferential distance along the first circumference between two adjacent additional first handling devices. Alternatively or in combination with this, the second handling devices are arranged on a second circumference at a second radial distance from the second axis of rotation, wherein the circumferential distance along the second circumference between two adjacent second handling devices is different from an additional circumferential distance along the second circumference between two adjacent additional second handling devices.

The described non-equidistant spacing between different pairs of adjacent handling devices for one and the same rotor assembly offers the advantage that not only two components, but four components, can be removed or collected simultaneously from one component feeding system that has at least four component feeding devices preferably in the form of belt conveyors that are arranged at a defined and possibly non-equidistant distance from one another.

The first rotor assembly and/or the second rotor assembly is preferably configured in such a way that there are only two different circumferential distances, a first distance and a second distance. In other words, the different distances can alternate. For example, for the first rotor assembly, this means that along the first circumference (i) the distance between a first first handling device and a second first handling device is the first distance, (ii) the distance between the second first handling device and a third first handling device is the second Distance is, (iii) the distance between the third first handling device and a fourth first handling device is again the first distance, and so on.

According to a further embodiment of the invention, the placement head further comprises a camera that is attached to the chassis and that is configured to detect picked-up components.

A camera moving together with the placement head in a so-called "pick-and-place placement operation" makes it possible to advantageously carry out measurement of the components during the (short as possible and thus rapid) movement of the placement head from a component feeding system to the placement area, in which the component carrier that is to be assembled is found.

A detour around a so-called stationary camera is therefore not necessary and the placement rate of the respective placement machine can be increased.

Solely for the sake of completeness, it should be stated that the sense and purpose of such component measurement is to determine the exact position and the angular position of a picked-up component in relation to the respective component holding device. Knowledge of the physical position and angular position are specifically required in a known manner in order to place the picked-up component in the correct orientation on the component carrier after generally requiring a compensation in the positioning of the entire placement head and a compensation in the rotation of the sleeve.

It should be noted that during the above-mentioned transverse movement of the placement head, not just one single component but rather a plurality of picked-up components can be detected. During this transverse movement, specifically the first rotor assembly and/or the second rotor assembly can be rotated such that more than one component comes into the camera's detection range consecutively. In cases where the camera's field of view is sufficiently wide, components of both rotor assemblies can also be detected.

According to a further embodiment of the invention, the camera is movably attached to the chassis. The mobility of the camera can be achieved, for example, by means of a suitable swivelling mechanism.

When it is located in a first position in relation to the chassis, the movable camera can detect the picked-up components, so long as they are in its detection range. In a second position, the camera can be located outside the range of motion of the sleeves, so that it is not in the way of the picking up or placement of components.

According to a further embodiment of the invention, the placement head further comprises an additional camera that is (stationarily) attached to the chassis and that is configured to detect additional picked-up components. The first camera is preferably assigned to the first rotor assembly, which means that the first camera can detect those components that are held by the first handling device or their sleeves. Correspondingly, the additional camera can be assigned (exclusively) to the second rotor assembly.

The use of the additional camera has the advantage that the fields of view of the camera can be smaller in comparison to a camera system with only one camera. As a result, the camera system can be constructed more compactly or in a smaller size. A further advantage of the described second camera can be seen in that a plurality of components can be detected even over a comparatively short travel path with a typically relatively short travel time for the placement head. This can lead to a further increase in the placement rate.

Naturally, the second camera can also be movably attached to the chassis. This results in the same advantages for the second camera that are described above for the first camera.

Depending on the specific application, all cameras described in this document can be designed as matrix cameras with a 2D sensor chip or as line scan cameras with a 1D sensor chip. In the case of a line scan camera, 2D image acquisition requires relative movement between the component and camera in a known manner.

According to a further embodiment of the invention, the placement head further comprises a data processing unit that is connected downstream of the camera or the additional camera, and that is configured to perform an evaluation of the image taken of each individual component.

The described movable data processing unit can considerably reduce the requirements for data transmission between (i) the placement head or the camera in question and (ii) a master data processing device that may be responsible for superordinate control of the entire placement operation. Transmitting the complete image data from each recorded image is no longer necessary, only information about the physical position and angular position of the picked-up component in question is needed so that a positioning system for the complete placement head and the drive devices for the individual handling devices of the placement head can be appropriately controlled.

It should be noted that in other embodiments, not only the overall machine control but also the above-described evaluation of the images captured by the camera and/or the additional camera can be performed by a stationary data processing unit or one that is directly or indirectly attached to the chassis of the placement machine. The data processing unit for evaluating images can be implemented in a data processing device by means of software and/or hardware; said data processing device controls the entire operation of the placement machine and is frequently also referred to as a machine computer.

According to a further embodiment of the invention, the placement head for each first handling device and/or each second handling device further comprises a component sensor that detects (i) the presence of a component and/or (ii) the relative position between a picked-up component and the relevant sleeve picking it up.

The component sensor is preferably an optically and/or electronically simple optoelectronic component, for example a (laser) light barrier with a (laser) diode and a photodiode. When a component is detected, it is located between the (laser) diode and the photodiode.

The described configuration of the placement head, in which each handling device is assigned its own component sensor, has the advantage that (i) component position recognition and/or (ii) a component presence check can be carried out simultaneously for all components that have been picked up. In such a component presence check, process errors where a component was incorrectly not picked up can be recognized and incorrect placement can be avoided by the automatic or manual re-placement of the component in question.

According to a further aspect of the invention, a placement machine is described for automatically placing electronic components on a component carrier. The described placement machine has (a) a frame base structure; (b) a positioning system with a stationary component and a movable component, wherein the stationary component is attached to the frame base structure; and (c) a placement head of the type described above. The chassis of the placement head is attached to the movable component of the positioning system.

The described placement machine is based on the recognition that the placement head described above, wherein the distances between two handling devices or sleeves, one from the first rotor assembly and one from the second rotor assembly, can be freely set through the selection of a suitable relative angle of rotation between the two rotor assemblies within a predetermined range of distances, for a particularly effective and thus rapid placement process. With the described placement head, both (a) the simultaneous picking up of two electronic components, that are each provided at a collection position, and (b) the simultaneous placement of two picked-up electronic components on a component carrier that is to be assembled is possible. The two electronic components can be placed on a component carrier that is to be assembled both with a high degree of accuracy within an xy-placement plane as well as with a precise angular position on predetermined connection pads.

In order to enable the placement of electronic components on a component carrier that is to be assembled at any position on the component carrier, the positioning system is preferably a so-called surface positioning system, with which the placement head can be moved freely within a predetermined positioning range in the above-mentioned xy-plane that is oriented perpendicular to the axis of rotation of the rotor or to the z-direction. However, it should be noted that instead of a surface positioning system, a simple linear positioning system can also be used as long as the component carrier that is to be assembled with a plurality of electronic components can be simultaneously displaced perpendicular to the direction of movement of the linear positioning system during the placement process.

According to a further embodiment of the invention, the placement machine further comprises a component feeding system that has (i) a first component feeding device by means of which electronic components are supplied at a first collection position, and (ii) a second component feeding device by means of which electronic components be supplied at a second collection position. The two collection positions are spaced from each other such that the placement head can simultaneously collect a first electronic component from the first collection position and a second electronic component from the second collection position.

If the two component feeding devices are so-called belt conveyors that sequentially convey electronic components packaged in a belt to their collection position, then the distance between the two collection positions is at least roughly established. However, since the electronic components typically have a certain amount of play within a pick-up pocket formed in the respective belt, minor deviations may arise in the actual position of the component to be collected from the predetermined component collection position. Compensation for such deviations can be made simply and effectively with the described placement head, wherein the distance between a first sleeve of the first block and a second sleeve of the second block can be freely adjusted. Therefore, in all cases, a first component can be collected with a first sleeve and a second component can be collected with a second sleeve simultaneously.

However, the placement head described in this document can also be used advantageously in a placement machine that has a component feeding system with at least two component feeding devices, each of which is designed as a so-called bulk material conveyor. With such bulk material conveyors, the components are only provided individually within a specific collection area; the exact position of an electronic component that is to be collected is not specified within the collection area. If the precise position of an electronic component that is to be collected is determined, for example, by means of a suitable vision or image recognition system, the placement head described in this document can be set so that the distance between a certain first sleeve of the first block and a certain second sleeve of the second block is precisely as great as the distance between two specific components that are provided in different collection areas. Thus, even in the case of a bulk material conveyor, the simultaneous picking up of two electronic components can be guaranteed simply and reliably, thus a significant increase in the placement rate can be achieved.

According to a further aspect of the invention, a method is described for automatically placing electronic components on a component carrier by means of the placement machine described above and/or by means of the placement head described above. The method comprises (a) picking up a first electronic component from a first collection position with a first component holding device that is attached to a first sleeve of the first rotor assembly of the placement head; (b) picking up a second electronic component from a second collection position with a second component holding device that is attached to a second sleeve of the second rotor assembly of the placement head; (c) transporting the two picked-up electronic components into a placement area in which is located a component carrier that is to be assembled; (d) placing the transported first electronic component at a first installation position on the component carrier; and (e) placing the transported second electronic component on a second installation position on the component carrier.

The described placement process is based on the recognition that, with the placement head described above, both (i) the simultaneous picking up of two electronic components provided at different collection positions as well as (ii) the simultaneous placement of two picked-up electronic components at predetermined positions on the component carrier that is to be assembled is possible. The collection position of each electronic component is rendered by the type of component feeding system providing the electronic components at a respective collection position or within a respectively specified collection area. The installation position for each component is specified in a known manner through connection contacts or connection pads on the component carrier. The same applies to the angular position of the placed electronic component. As already described above, the angular position must be set by a suitable control for the placement head or the respective rotary drive so that reliable contact is ensured between the electrical connections of the respective component and the electrical connection contacts formed on the component carrier.

With the described "double turret placement head" the placement sequence, i.e. which components are placed in which chronological order at which positions on the component carrier, can be flexibly adapted. Here, the adjustment can be made in relation to one or more of the following objectives: (a) Optimizing the placement rate, (b) minimizing energy consumption, (c) maximizing precision, (d) minimizing wear on the placement head and/or the entire placement machine, etc.

According to one embodiment of the invention, the first electronic component and the second electronic component are picked up simultaneously. Alternatively or in combination with this, the transported first electronic component and the transported second electronic component are placed simultaneously.

The described temporal parallelization of the collection or picking up of at least two components from a component feeding system and/or the described temporal parallelization of placing at least two components on a component carrier that is to be assembled has the advantage that the entire placement process can be accelerated.

According to a further embodiment of the invention, the method further comprises (a) picking up an additional first electronic component from an additional first collection position with an additional first component holding device that is attached to an additional first sleeve of the first rotor assembly; (b) picking up an additional second electronic component from an additional second collection position with an additional second component holding device that is attached to an additional second sleeve of the second rotor assembly; (c) transporting, together with the two picked-up electronic components, the two picked-up electronic components into a placement area; (d) placing the transported additional first electronic component at an additional first installation position on the component carrier; and (e) placing the transported additional second electronic component on an additional second installation position on the component carrier. The additional first electronic component and/or the additional second electronic component is then picked up simultaneously as the first electronic component and the second electronic component are picked up. Alternatively or in combination with this, the placement of the transported additional first electronic component and/or the placement of the transported additional second electronic component occurs simultaneously with the placement of the transported first electronic component and the transported second electronic component.

The described simultaneous picking up and/or simultaneous placement of three or four components can significantly increase the placement rate of a corresponding placement machine. Specifically, this is because it is no longer necessary to move the entire placement head between the collection operations for the three or four different components. The same applies analogously to the described collective placement of three or four different components.

According to a further embodiment of the invention, the sleeve and/or a component holding device attached to the sleeve comprising at least one handling device is/are configured eccentrically to an axis of rotation of the rotary drive of the at least one handling device. The method further comprises actuating the rotary drive of the at least one handling device in such a way that the spacing is changed between (i) a tip of the component holding device and (ii) a tip of another component holding device, which is assigned another handling device of the first rotor assembly or the second rotor assembly. In this context, the term "eccentric" can mean in particular that the tip of the relevant component holding device is at least slightly outside the axis of rotation of the relevant rotary drive due to the corresponding shape of the sleeve and/or component holding device.

Targeted activation of the rotary drive in question can advantageously enable the fine adjustment of the spacing between the tips of two or more component holding devices. Such fine adjustment can be particularly advantageous when three or four components are to be picked up by the component feeding system at the same time and/or placed on the component carrier from predetermined positions.

Preference is given to not just one handling device, but to two or more handling devices that are equipped with the described "eccentric functionality". As a result, the range of the described fine adjustment for the distance between the tips of two or more component holding devices can be expanded.

According to a further aspect of the invention, a method is described for automatically placing electronic components on a component carrier by means of the placement machine described above and/or by means of the placement head described above. The described method comprises (a) picking up an electronic component from a collection position with a first component holding device and with a second component holding device; (b) transporting the picked-up electronic components into a placement area in which is located a component carrier that is to be assembled; and (c) placing the transported electronic components on an installation position on the component carrier.

The described method is based on the recognition that very large electronic components can also be placed with the above-described placement machine and/or with the above-described placement head. In this context, the term electronic component is to be interpreted very broadly. As already described above, the term "electronic component" used in this document can also include electrically inactive or passive components such as electrical plugs or connectors, heat sinks, shielding elements, housing parts, etc. that can be placed on a carrier.

The use of two component holding devices for picking up or holding a single (large) component has the advantage that a greater overall holding force that is strong enough to reliably hold even heavier components can be applied. Since the two component holding devices, which are preferably designed as suction grippers, can place two smaller components in other process cycles, the spectrum of different components that can be handled or processed with the placement head described above is broadened considerably.

Optical detection of a component picked up by (at least) two component holding devices can advantageously occur with a camera attached in a stationary manner to a frame base structure of the placement machine. The detection then takes place in the component's path from its collection position to the placement position, wherein this path runs over or through the detection area of the stationary camera.

According to one embodiment of the invention, the two component holding devices are each assigned to a sleeve of the first rotor assembly. Alternatively, the two component holding devices are each assigned to a sleeve of the second rotor assembly. The picking-up of the component by (at least) two component holding devices of the same rotor assembly has the advantage that the relative spacing between the two component holding devices always remains the same. This enables the rotation of the rotor assembly in question, for example, on the path from the component collection area to the placement area, even when the (large) component is held by the two component holding devices.

Depending on the size of the component, the two component holding devices can be component holding devices that are directly adjacent to each other or component holding devices that are spaced further apart from each other. Particularly large components can also be picked up or held by three or even more component holding devices.

According to a further embodiment of the invention, one of the two component holding devices is assigned to a sleeve of the first rotor assembly and the other of the two component holding devices is assigned to a sleeve of the second rotor assembly. This has the advantage that any distance between the two component holding devices picking up components can be set by a specific adjustment of the relative angle of rotation between the two rotor assemblies within a range of distances predetermined by the overall geometry of the placement head.

It should be noted that embodiments of the invention have been described with reference to different objects of the invention. In particular, some embodiments of the invention are described with device claims and other embodiments of the invention with procedural claims. However, when reading this application, it is immediately clear to the person skilled in the art that, if not otherwise explicitly stated, in addition to a combination of features belonging to one type of object of the invention, any combination of features belonging to different types of objects of the invention is possible.

Further advantages and features of the present invention arise from the following exemplary description of currently preferable embodiments.

BRIEF DESCRIPTION OF THE DRAWINGS

FIG. 2 shows a perspective view of the basic structure of a placement head according to one embodiment of the invention in.

DETAILED DESCRIPTION

It should be noted that, in the following detailed description, features or components of different embodiments that are identical or at least functionally identical to the corresponding features or components of another embodiment are provided with the same reference numerals or with reference numerals that are identical in the last two digits of the reference symbols of corresponding identical or at least functionally identical features or components. To avoid unnecessary repetitions, features or components that have already been explained on the basis of a previously described embodiment are no longer explained in detail at subsequent points.

Furthermore, it is noted that the following described embodiments only represent a limited selection of possible variations of embodiments of the invention. In particular, it is possible to combine the features of individual embodiments in a suitable manner, such that a multitude of different embodiments can be viewed as obviously disclosed for the person skilled in the art with the embodiments explicitly described here.

Figure 1:
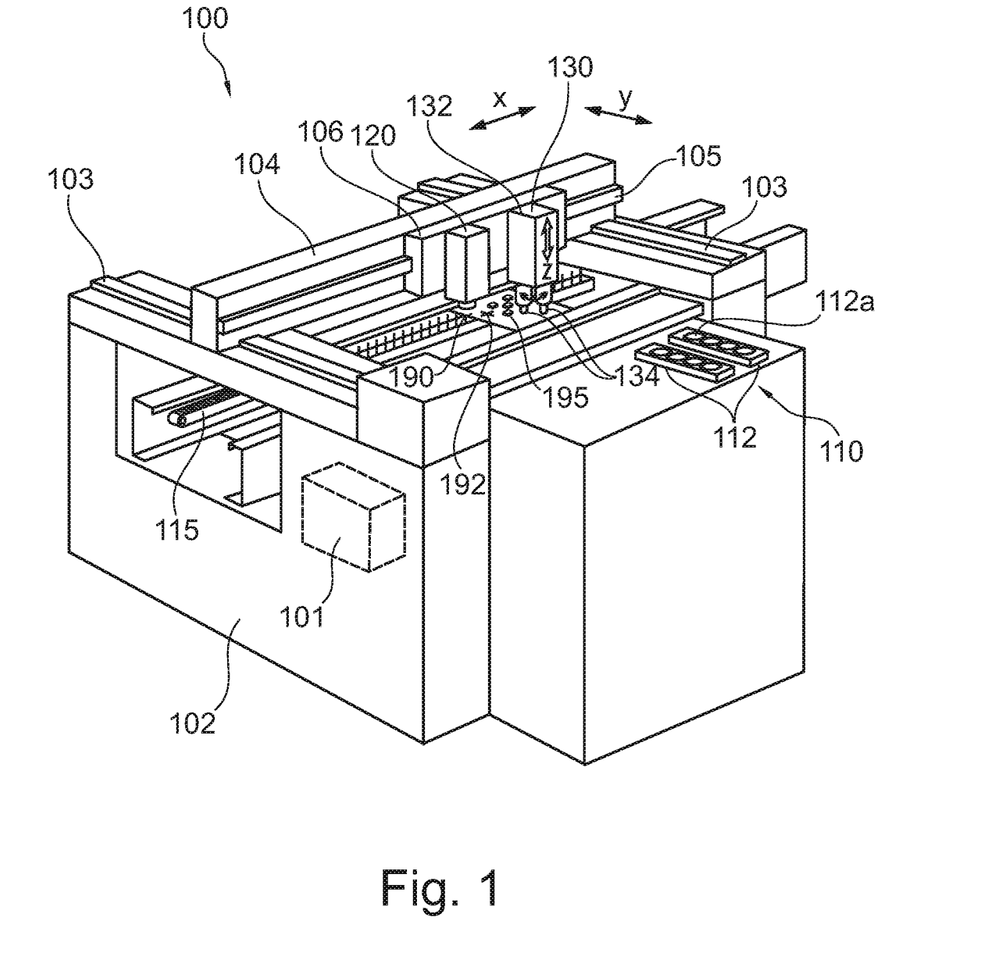
FIG. 1 shows a schematic perspective illustration of a placement machine according to one embodiment of the invention.

FIG. 1 shows a placement machine 100 that has a frame base structure 102 on which two parallel linear guides 103 are attached. The two linear guides 103 carry a transverse support arm 104. The transverse support arm 104 itself has a linear guide 105 on which a carrier element 106 is displaceably mounted. The two linear guides 103 run along a y-direction, the linear guide 105 runs along an x-direction. A placement head 130 is arranged on the carrier element 106. The linear guides 103, transverse support arm 104, linear guide 105 and carrier element 106 constitute a positioning system for the placement machine 100, with the linear guides 103 forming a stationary component of the positioning system and the carrier element 106 forming a movable component of the positioning system.

In accordance with embodiments of the invention, the placement head 130 has two rotor assemblies that are arranged concentrically to one another and that can be rotated relative to a chassis 132 of the placement head 130 about a common axis of rotation that is oriented along a z-direction. The z-direction is indicated in FIG. 1 with a straight double arrow. The rotary movement is indicated in FIG. 1 with a curved double arrow. Each of the two rotor assemblies has a plurality of handling devices that are arranged on a circumference at a certain radial distance from the axis of rotation. With each handling device, a component can be taken up, held while the placement head 130 is moving, and placed on a component carrier.

The radial distance of the handling devices of the one (inner) rotor assembly is smaller than the radial distance of the handling devices of the other (outer) rotor assembly. These characteristic structural properties of the placement head 130 are not shown in FIG. 1 for reasons of clarity. Only two component holding devices 134 designed as suction nozzles are visible, which are devices detachably attached in a known manner to the sleeves of two handling devices of the outer rotor assembly.

The placement machine 100 also comprises a component feeding system 110, shown schematically, that comprises at least two component feeding devices 112. The component feeding devices 112 provide electronic components (not shown) at a plurality of collection positions 112a for a so-called "Collect & Place" placement process. In this case, components of the same or different types can be supplied by means of different component feeding devices 112.

The placement machine 100 also comprises a conveyor belt 115 with which a component carrier 190 can be introduced into a placement area of the placement machine 100. The component holding devices 134 can be positioned parallel to the xy-plane within the entire placement area by a suitable translational movement of the placement head 130 and by a suitable rotational movement of the outer rotor assembly.

Furthermore, the placement machine 100 has a master data processing device 101. A processing program can be run on this for the placement machine 100 to place electronic components 195 on the component carriers 190, so that all components of the placement machine 100 work in a precisely coordinated manner and thus contribute to the error-free and rapid placement of components 195 on component carriers 190.

A so-called circuit board camera 120, which is provided for detecting at least one marking 192 placed on the component carrier 190, is additionally secured to the carrier element 106. In this manner, the exact position of the component carrier 190 introduced into the placement area can be determined by measuring the position of the at least one marking 192 within the field of view of the circuit board camera 120.

It should be pointed out that the components 195 can also be detected by a stationary camera (not shown) on their way to the component carrier 190. Such a stationary camera is arranged in a stationary manner in relation to the frame base structure 102 and is attached directly or indirectly to the frame base structure 102.

Figure 2:
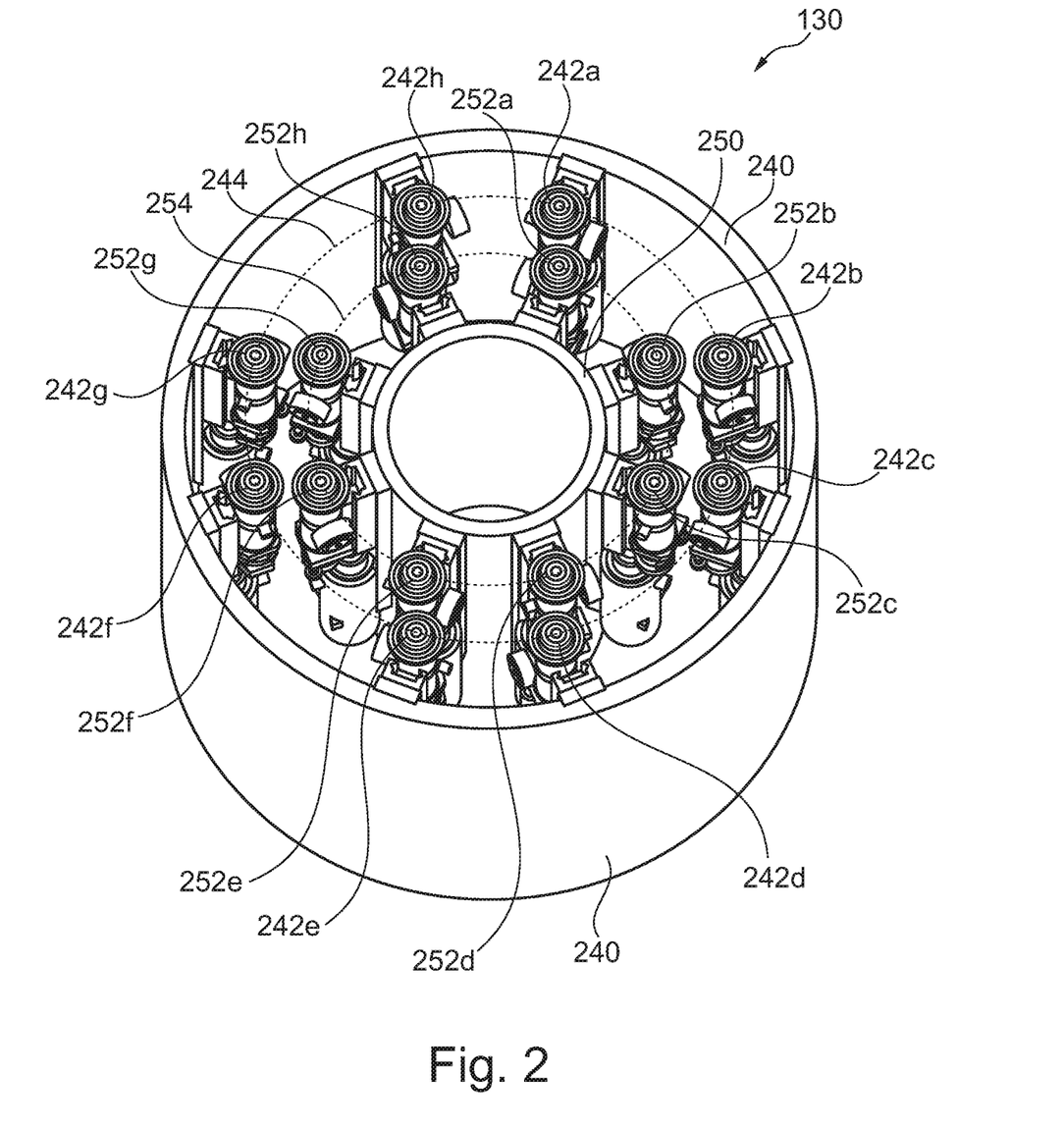

FIG. 2 shows a perspective view of the basic structure of the placement head 130 according to one embodiment of the invention. The placement head has two rotor assemblies, a first rotor assembly 240 and a second rotor assembly 250. The two rotor assemblies 240, 250 are arranged concentrically to each other and are rotatable about an axis of rotation (not shown).

A plurality of first handling devices is attached to a first cylindrical body of the first rotor assembly 240 and are designated by reference numerals 242a, 242b, 242c, 242d, 242e, 242f, 242g and 242h. The handling devices 242a-h are located on a first circumference 244, which is shown with dashed lines in FIG. 2. Correspondingly, multiple second handling devices are attached to a second cylindrical body of the second rotor assembly 250 and are designated by reference numerals 252a, 252b, 252c, 252d, 252e, 252f, 252g and 252h. The handling devices 242a-h are located on a second circumference 254, which is also shown with dashed lines in FIG. 2.

All of the handling devices 242a-h and 252a-h have, in particular, a sleeve (not shown in greater detail in FIG. 2 for reasons of clarity) and a drive device (also not shown in detail). The sleeve is configured in a known manner such that a component holding device designed as a suction nozzle can be detachably attached for temporarily picking up a component. The drive device has (i) a linear drive for moving the sleeve along its longitudinal axis and (ii) a rotary drive for rotating the sleeve about its longitudinal axis. The drive device is therefore able to displace the suction nozzle both along its longitudinal axis or in a z-direction and to rotate it about its longitudinal axis. These two movements are required in a known manner in order to take up an electronic component and later to place it in the correct position on a component carrier that is to be assembled. The construction of the handling devices is explained in greater detail below with reference to FIG. 4.

Figure 3:
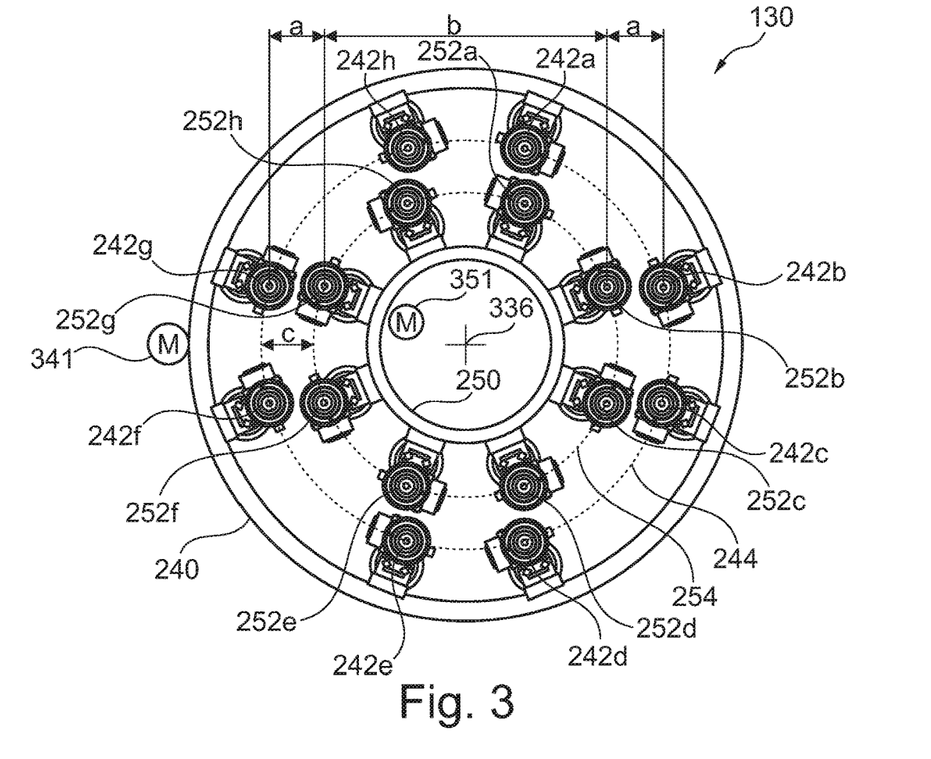
FIG. 3 shows a top view of the placement head.

FIG. 3 shows a top view of the placement head 130. The common axis of rotation 336 is labelled with reference numeral 336. In this FIG. 3, the two concentrically arranged rotor assemblies 240, 250 can be seen particularly well, together with their handling devices 242a-h and 252a-h. The "radial distance" between (i) the first circumference 244 of the outer first rotor assembly 240 and (ii) the second circumference 254 of the inner second rotor assembly 250 is designated by "c" in FIG. 3.

Due to the concentric arrangement of the two rotor assemblies 240, 250 with the many handling devices, the placement head 130 can clearly also be called a "double turret placement head". The English term "turret" translates as "Werkzeugrevolver" [revolver head] in German.

The first rotor assembly 240 and the second rotor assembly 250, which are driven by a first motor 341 and a second motor 351, respectively, can be rotated about the axis of rotation 336 as desired and independently of each other. Taking into consideration (i) the so-called XY positioning of the entire placement head 130 within the coordinate system of a placement machine and (ii) the rotational position or angular position of the two rotor assemblies 240, 250, at least two of the handling devices can be positioned so that their distance a is precisely as great as the distance between the collection positions of two adjacent component feeding devices of a component feeding system. In FIG. 3, these are (i) a handling device 242b or 242g of the first handling devices 242a-h and (ii) a handling device 242g or 252g of the second handling devices 252a-h. Such positioning that has been adapted to the spatial structure of the component feeding system advantageously makes it possible to take up two components simultaneously. Naturally, this also applies in the event that distance a corresponds to a multiple of the distance between two adjacent collection positions.

In addition, if distance b between two handling devices of one and the same rotor assembly, in FIG. 3 where the distance between the second handling device 252b and the second handling device 252g corresponds to a multiple of the distance between two adjacent collection positions, then four components can be simultaneously taken up from a corresponding component feeding system. As a result, the process of taking up a plurality of components can be accelerated in comparison to picking up the components sequentially, so that the placement rate of the placement head is correspondingly increased.

Correspondingly, the same also applies to the process of placing the components on a component carrier. However, it should be noted that the placement positions of the various components are typically not on a uniform grid. This spacing of the placement positions, which is typically different for each placement operation, can at least be produced for two components by appropriately setting the relative angle of rotation between the two rotor assemblies. As a result, at least two components can be placed simultaneously with the described placement head 130, which leads to an additional acceleration in placement processes compared to a sequential placement of components.

Figure 4:
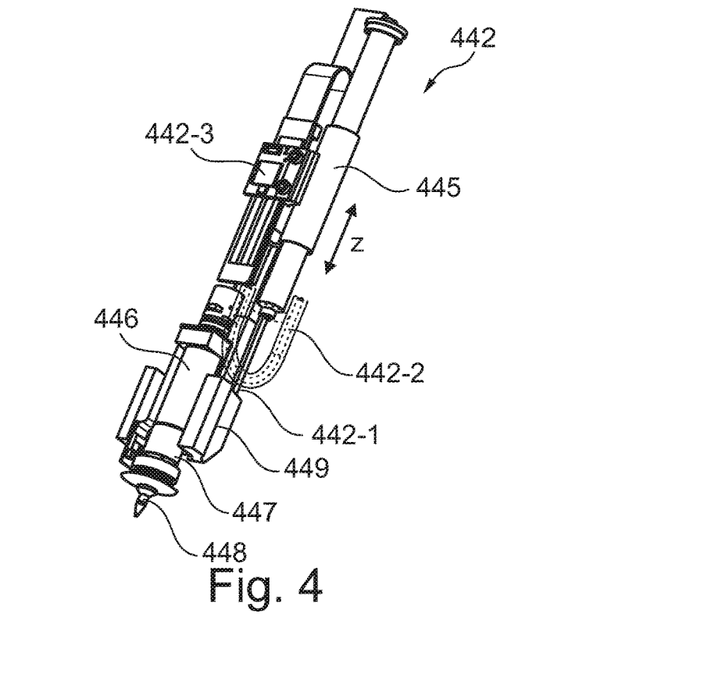
FIG. 4 shows a perspective view of the handling device.

FIG. 4 shows a perspective view of a (first) handling device 442. The second handling devices 252a-h shown in the two previous FIGS. 2 and 3 are constructed in the exact same way.

The handling device 442 comprises a drive device consisting of a linear drive 445 and a rotary drive 446. The rotary drive 446 can be displaced along a z-direction by means of the linear drive 445 on a linear guide 442-1. The rotary drive 446 is coupled to a sleeve 447 that is rotated about its longitudinal axis when the rotary drive 446 is actuated. The longitudinal axis of the sleeve 447 also runs along the z-direction.

A component holding device designed as a suction gripper can be attached to the front end of the sleeve 447 in a known manner. This is identified with reference numeral 448 in FIG. 4. A component can then be held on the front side of the suction gripper 448, likewise in a known manner, by means of a pneumatic vacuum. To generate this vacuum, a vacuum generation unit (not shown) is provided, which transfers the generated negative pressure to a suction channel of the suction gripper via a pneumatic hose 442-2. The vacuum generation unit can be a central unit in a known manner, which "distributes" the negative pressure to the individual suction grippers of the various handling devices through suitable pneumatic switch valves.

The handling device 442 further comprises two encoders. A first encoder detects the current z-position of the sleeve 447 or the attached suction gripper 448. This encoder is identified with reference numeral 442-3 in FIG. 4. The second encoder detects the current angle of rotation of the sleeve or of a component taken up by the suction gripper 448.

According to the embodiment depicted here, the handling device 442 further comprises a component sensor 449. Provided that the linear drive 445 is in its upper position, the linear drive 445 can be set in such a way that a component that has been picked up is within the detection range of the component sensor 449.

According to the embodiment depicted here, the component sensor 449 and a downstream evaluation unit (not shown) are configured to detect (i) the presence of a component and/or (ii) the relative position between a picked-up component and the sleeve picking it up. The component sensor is a light barrier with (i) a light-emitting diode or a laser diode and (i) a photodiode. When a component is detected, it is located between the diode and the photodiode.

Figure 5A:
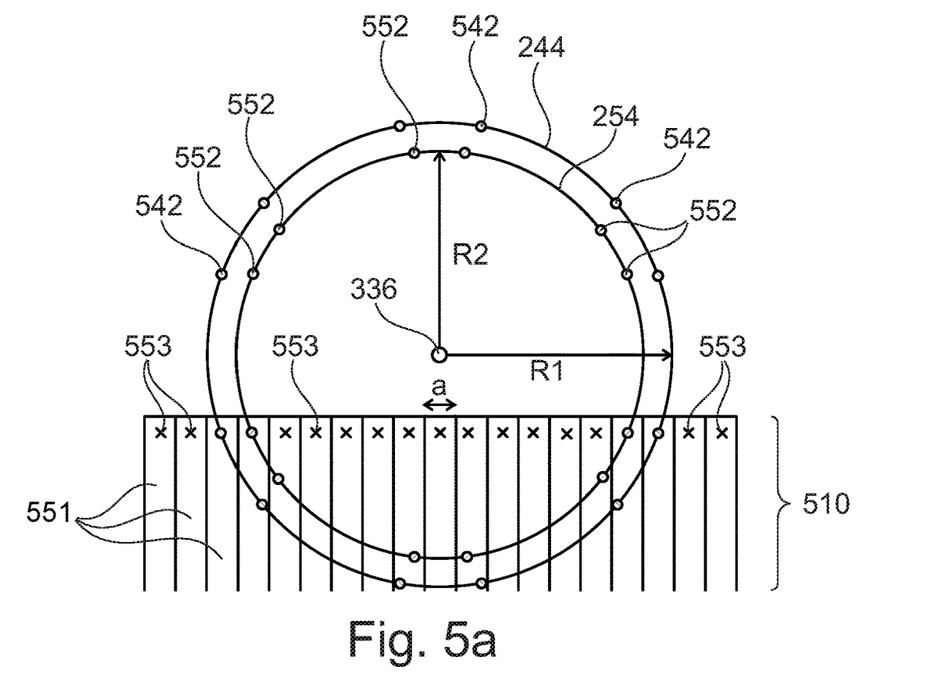
FIG. 5a and FIG. 5b illustrate the geometries of two different placement heads in relation to a predetermined spacing between two component feeding devices of a component feeding system.
Figure 5B:
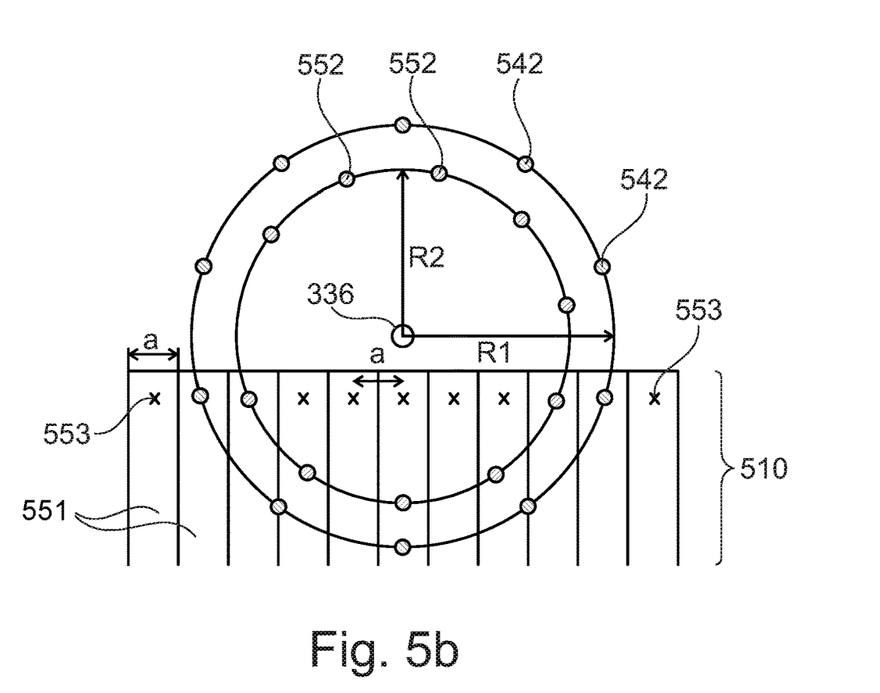

FIGS. 5*a* and 5*b* illustrate the geometries of two different placement heads in relation to the spatial and physical configuration of a component feeding system 510. As is evident from these two figures, the component feeding system 510 has a plurality of component feeding devices 551 that are arranged directly next to each other. According to the embodiment depicted here, all component feeding devices have a width a, which is shown on the left with a double arrow in FIG. 5*b*. The component collection positions are each indicated by a cross in both FIGS. 5*a* and 5*b*, and are labelled with reference numeral 553. The component collection positions 553 are each located in the middle of a component feeding device 551. Therefore, the distance between two adjacent component collection positions 553 is also the above-mentioned width a.

A double turret placement head that has 2×12 handling devices is illustrated in FIG. 5*a*. Twelve first handling devices 542, which are assigned to an outer first rotor assembly, lie on a first circumference 244, which is spaced from the common axis of rotation 336 by a first radial distance R1. Twelve second handling devices 552, which are assigned to an inner second rotor assembly, lie on a second circumference 254, which is spaced from the common axis of rotation 336 by a second radial distance R2.

As can be seen in FIG. 5*a*, both the first handling devices 542 as well as the second handling devices 552 are not arranged equidistantly from each other on their respective circumferences 244 and 254. Specifically, along the perimeter of the relevant circumference, some pairs of handling devices that are adjacent to each other are spaced at a comparatively small distance and other pairs of handling devices that are adjacent to each other are spaced at a comparatively large distance. According to the embodiment depicted here, the short distances and long distances alternate along the direction of the perimeter. This applies for both rotor assemblies.

Radial distances R1 and R2 as well as the different perimeter distances between two adjacent handling devices on the two circumferences 244 and 254 are selected so that four components can be removed from the component feed system 510 simultaneously when the physical position of the placement head and angular position of the two rotor assemblies are suitably configured. This is evident in FIG. 5*a* by the fact that the four handling devices in question "cover" the four corresponding collection positions.

A double turret placement head that has 2×10 handling devices is illustrated In FIG. 5*b*. The first handling devices are also identified here with reference numeral 542 and the second handling devices are identified with reference numeral 552.

The distribution of the handling devices along the perimeter is also not completely equidistant with the placement head according to FIG. 5*b*. However, together with the two radial distances R1 and R2, the distribution is such that four handling devices can simultaneously take up components again.

Figure 6:
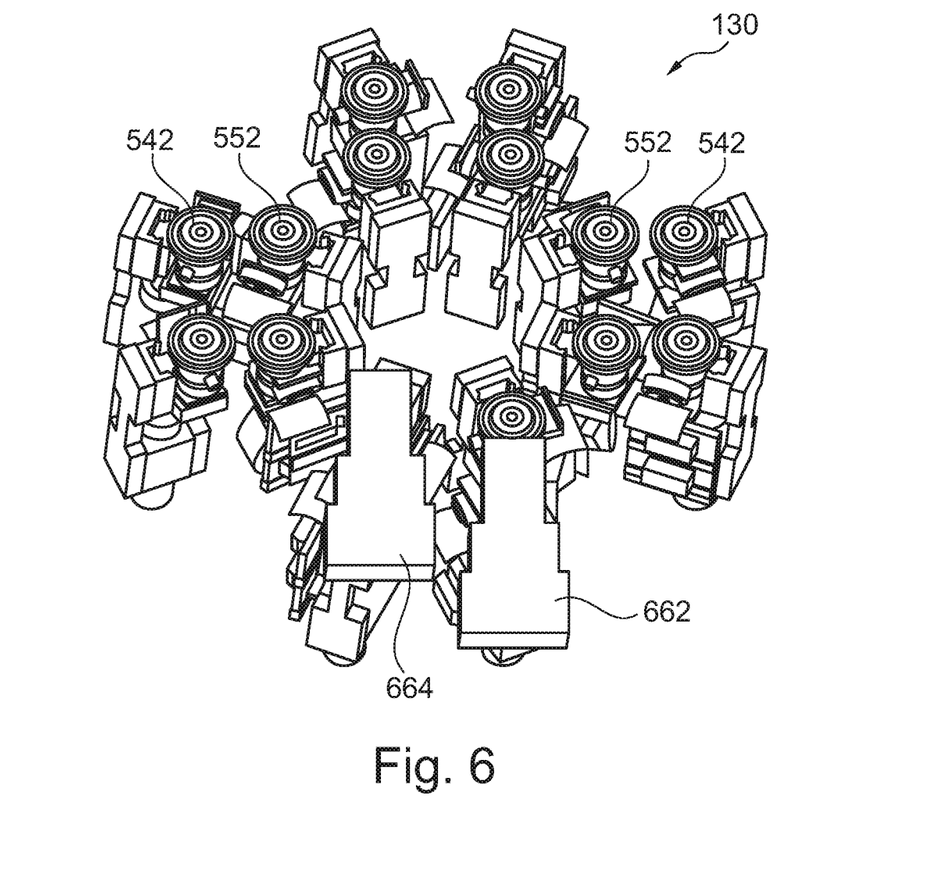
FIG. 6 shows a placement head with two cameras for measuring the physical position and the angular position of picked-up components.

FIG. 6 shows a perspective view of the placement head 130 with two cameras for measuring the physical position and the angular position of picked-up components. A first camera 662 is configured and arranged to detect components that are each held by a first handling device 542 from below. A second camera 664 is configured and arranged to detect components that are each held by a second handling device 552 from below.

When the two rotor assemblies rotate, the components held by all handling devices are moved one after another through the detection area of the first camera 662 and the detection area of the second camera 664. This detection of the held components takes place as already previously described while the components are being transported from the component feeding system to the placement area. As soon as the placement head 130 has reached the placement area, the two cameras 662 and 664 are folded away by means of a swivelling mechanism (not shown) so that all components are moved downwards spatially unimpeded by the camera through actuation of the linear drive 445 depicted in FIG. 4 and thus can be placed on the component carrier that is to be assembled. The two cameras 662 and 664 are also in the "folded away" position when components are being picked up so that components can be picked up unhindered in the area of the component feeding system 510.

It should be noted that, deviating from the illustration in FIG. 6, at least one of the two cameras 662, 664 or a holder of at least one of the two cameras 662, 664, can be attached to or integrated into a supporting bearing of the inner rotor assembly.

Further information on features and/or advantages of possible embodiments of the invention are described below:

For optically sharp detection of the components, a height sensor (e.g., a light barrier or a so-called light curtain, not shown), can initially be used to detect component position. Based on this information, the component or the surface of the component that is relevant for detection can be brought into the camera's focus through proper actuation of the linear drive.

Depending on the specific application and, in particular, on the optical properties (of the surfaces) of the components, different illumination light with different spectral properties can be used for component detection. The light colours of blue, blue and red or also white have proven to be suitable for the reliable optical detection of components.

Two or more image recordings of a component can also be taken during placement operations using different illumination settings. This can take place in a short period of time during which the component in question is at a fixed position within the camera's detection range, because the rotor assembly in question is at rest during this period of time. Alternatively, the two images can also be moved through the camera's detection area while the component is moving. The two image recordings can be evaluated together, for example, to detect component tilting reliably. The camera can also be a so-called Multi-Field Of View (MFOV) camera. In this case, a large camera image can be generated by joining together ("stitching") various smaller individual recordings, wherein the individual recordings show (usually overlapping) sections of the component. Such "stitching" can be used in an advantageous manner, particularly for large components.

The image recordings can be synchronized with the rotational movement of the rotor assembly in question. This can be done, for example, via a synchronization light flash, which is emitted by a light transmitter located in or on the camera in the case of a stationary camera, and received by an appropriate light receiver on the moving part of the placement head.

Cleaning the camera regularly can also help with capturing high-quality images. Such cleaning can be performed by means of a cleaning nozzle, blown air pulses from an empty suction nozzle and/or a special cleaning tool picked up by a handling device.

It is noted that the term "have or comprising" does not exclude other elements and that the word "one or a" does not exclude a plurality. Elements, which are described in connection with different exemplified embodiments, can also be combined. It should also be noted that reference numerals in the claims should not be construed as limiting the scope of the claims.

REFERENCE NUMERALS

100 Placement machine
101 Master data processing device
102 Frame base structure
103 Linear guides
104 Transverse support arm
105 Linear guide
106 Carrier element
110 Component feeding system
112 Component feeding devices
112a Collection positions
115 Conveyor belt
120 Circuit board camera
130 Placement head
132 Chassis
134 Component holding device/Suction nozzle
190 Component carrier
192 Marking
195 Component
240 First rotor assembly
242a-h First handling devices
244 First circumference
250 Second rotor assembly
252a-h Second handling devices
254 Second circumference
336 (Common) axis of rotation
341 First motor
351 Second motor
442 First handling device
445 Linear drive
446 Rotary drive
447 Sleeve
448 Component holding device/Suction gripper
449 Component sensor
442-1 Linear guide
442-2 Pneumatic hose
442-3 Optical encoder
510 Component feeding system
551 Component feeding device
553 Component collection position
542 First handling device
552 Second handling device
662 First camera
664 Second camera
a Spacing between the first handling device and the second handling device/
Wide component feeding device/Spacing between adjacent collection positions
b Spacing between two second handling devices
c Radial distance between the first circumference and the second circumference
R1 First radial distance
R2 Second radial distance

The invention claimed is:

1. A placement head for automatically placing electronic components on a component carrier, the placement head comprising:
a chassis;
a first rotor assembly that is mounted so that it is rotatable relative to the chassis about a first axis of rotation and that has a first quantity of first handling devices; and
a second rotor assembly that is mounted so that it is rotatable relative to the chassis about a second axis of rotation and that has a second quantity of second handling devices;
wherein each handling device comprises:
a sleeve, on which a component holding device for temporarily picking up a component can be mounted, and
a drive device comprising:
(i) a linear drive for moving the sleeve along its longitudinal axis and
(ii) a rotary drive for rotating the sleeve about its longitudinal axis,
for enabling two or more components to be placed on the component carrier simultaneously or independently,
wherein the first axis of rotation and the second axis of rotation are on a common axis of rotation.

2. The placement head according to claim 1, further comprising:
a first motor for rotating the first rotor assembly; and
a second motor for rotating the second rotor assembly;
wherein the first and second motors can be controlled independently of each other, so that the first rotor assembly can be rotated independently of the second rotor assembly.

3. The placement head according to claim 2, wherein the first motor is configured to rotate the first rotor assembly continuously or at least quasi-continuously; and/or wherein the second motor is configured to rotate the second rotor assembly continuously or at least quasi-continuously.

4. The placement head according to claim 1, wherein the first quantity of the first handling devices is the same as the second quantity of the second handling devices.

5. The placement head according to claim 1, wherein:
the first handling devices are arranged on a first circumference at a first radial distance from the first axis of rotation, wherein the circumferential distance along the first circumference between two adjacent first handling devices is different from an additional circumferential distance along the first circumference between two adjacent additional first handling devices; and/or
the second handling devices are arranged on a second circumference at a second radial distance from the second axis of rotation, wherein the circumferential distance along the second circumference between two adjacent second handling devices is different from an additional circumferential distance along the second circumference between two adjacent additional second handling devices, such that there is non-equidistant spacing between different pairs of adjacent first handling devices on the first circumference and/or between different pairs of adjacent second handling devices on the second circumference.

6. The placement head according to claim 1, further comprising a camera that is attached to the chassis and that is configured to detect picked-up components.

7. The placement head according to claim 6, wherein the camera is movably attached to the chassis.

8. The placement head according to claim 7, further comprising an additional camera that is attached to the chassis and that is configured to detect additional picked-up components.

9. The placement head according to claim 6, further comprising a data processing unit that is connected downstream of the camera, and that is configured to perform an evaluation of the image taken of each individual component.

10. The placement head according to claim 1, further comprising:

for each first handling device and/or each second handling device, a component sensor that detects the presence of a component and/or the relative position between a picked-up component and the relevant sleeve that picks it up.

11. A placement machine for automatically placing electronic components on a component carrier, the placement machine comprising:

a frame base structure;

a positioning system with a stationary component and a movable component, wherein the stationary component is attached to the frame base structure; and the placement head according to claim 1, wherein the chassis of the placement head is attached to the movable component of the positioning system.

12. The placement machine according to claim 11, further comprising:

a component feeding system comprising:

a first component feeding device by means of which electronic components are supplied at a first collection position, and a second component feeding device by means of which electronic components are supplied at a second collection position, wherein the first and second collection positions are spaced from each other such that the placement head can simultaneously collect a first electronic component from the first collection position and a second electronic component from the second collection position.

* * * * *